US011171013B2

(12) United States Patent
Oehrlein et al.

(10) Patent No.: US 11,171,013 B2
(45) Date of Patent: Nov. 9, 2021

(54) LEVERAGING PRECURSOR MOLECULAR COMPOSITION AND STRUCTURE FOR ATOMIC LAYER ETCHING

(71) Applicant: University of Maryland, College Park, MD (US)

(72) Inventors: Gottlieb S. Oehrlein, Clarksville, MD (US); Kang-Yi Lin, Greenbelt, MD (US); Chen Li, College Park, MD (US)

(73) Assignee: University of Maryland, College Park, College Park, MD (US)

( * ) Notice: Subject to any disclaimer, the term of this patent is extended or adjusted under 35 U.S.C. 154(b) by 0 days.

(21) Appl. No.: 16/390,223

(22) Filed: Apr. 22, 2019

(65) Prior Publication Data

US 2020/0335352 A1 Oct. 22, 2020

(51) Int. Cl.
| | |
|---|---|
| *H01L 21/3213* | (2006.01) |
| *H01L 21/311* | (2006.01) |
| *H01L 21/02* | (2006.01) |
| *C23C 16/455* | (2006.01) |
| *H01L 21/3065* | (2006.01) |

(52) U.S. Cl.
CPC .. *H01L 21/32136* (2013.01); *C23C 16/45553* (2013.01); *H01L 21/02019* (2013.01); *H01L 21/0228* (2013.01); *H01L 21/02205* (2013.01); *H01L 21/02274* (2013.01); *H01L 21/3065* (2013.01); *H01L 21/31116* (2013.01); *H01L 21/32135* (2013.01); *H01L 21/32137* (2013.01)

(58) Field of Classification Search
None
See application file for complete search history.

(56) References Cited

U.S. PATENT DOCUMENTS

| | | | |
|---|---|---|---|
| 9,620,382 B2 | 4/2017 | Oehrlein et al. | |
| 2009/0176375 A1* | 7/2009 | Benson | H01L 21/31116 438/719 |
| 2015/0162168 A1* | 6/2015 | Oehrlein | H01J 37/32146 438/694 |

OTHER PUBLICATIONS

C. Li et al., "Fluorocarbon based atomic layer etching of Si3N4 and etching selectivity of SiO2 over Si3N4", J. Vac. Sci. Technol. A, vol. 34, pp. 041307-1 to 041307-12. (Year: 2016).*

(Continued)

*Primary Examiner* — Jiong-Ping Lu
(74) *Attorney, Agent, or Firm* — Stanek Lemon Crouse & Meeks, PA (57) ABSTRACT

Provided is a method of selectively etching a substrate comprising at least one cycle of: depositing a chemical precursor on a surface of the substrate to form a chemical precursor layer on the substrate, the substrate comprising a first portion and a second portion, wherein the first and the second portion are of a different composition; selectively removing the chemical precursor layer and at least a part of the first portion of the substrate; and repeating the cycle until the first portion of the substrate is substantially or completely removed, wherein deposition of the chemical precursor and selective removal of the chemical precursor layer and at least a part of the first portion of the substrate are performed under a plasma environment.

16 Claims, 5 Drawing Sheets

(56) References Cited

OTHER PUBLICATIONS

Engelmann et al., "Plasma-surface interactions of model polymers for advanced photoresists using $C_4F_8$/Ar discharges and energetic ion beams," Journal of Vacuum Science & Technology B: Microelectronics and Nanometer Structures Processing, Measurement and Phenomena 25, 1353 (2007).
Lin et al., "Achieving ultrahigh etching selectivity of SiO2 over Si3N4 and Si in atomic layer etching by exploiting chemistry of complex hydrofluorocarbon precursors," Journal of Vacuum Science & Technology A 36, 040601 (2018).
Li et al., "Fluorocarbon based atomic layer etching of $Si_3N_4$ and etching selectivity of $SiO_2$ over $Si_3N_4$," Journal of Vacuum Science & Technology A 34, 041307 (2016).
Li et al., "Impact of hydrofluorocarbon molecular structure parameters on plasma etching of ultra-low-K dielectric," Journal of Vacuum Science & Technology A 34, 031306 (2016).
Metzler et al. "Fluorocarbon assisted atomic layer etching of $SiO_2$ and Si using cyclic Ar/$C_4F_8$ and Ar/$CHF_3$ plasma," Journal of Vacuum Science & Technology A 34, 01B101 (2016).
Metzler et al., "Fluorocarbon assisted atomic layer etching of $SiO_2$ using cyclic Ar/$C_4F_8$ plasma," Journal of Vacuum Science & Technology A 32, 020603 (2014).
Standaert et al., "Patterning of fluorine-, hydrogen-, and carbon-containing $SiO_2$-like low dielectric constant materials in high-density fluorocarbon plasmas: Comparison with $SiO_2$," Journal of Vacuum Science & Technology A 17, 741 (1999).

* cited by examiner

LEVERAGING PRECURSOR MOLECULAR COMPOSITION AND STRUCTURE FOR ATOMIC LAYER ETCHING

BACKGROUND

The development of atomic layer etching (ALE) approaches has many promising performance characteristics, including simple process steps, self-limited etching, improved uniformity, and potentially ultrahigh material etch selectivity required for advanced semiconductor manufacturing. Utilization of the chemical nature of precursors may have significant potential for advancements in ALE over conventional steady-state plasma etching, enabling greater control over surface reactions. Manipulating the chemical nature of precursors in an ALE process may lead to novel processing margins for Angstrom-level etch controllability which to date have not been attainable.

The interaction between plasma dissociated reactive gas and substrate significantly affects etching results, including etching selectivity and pattern transfer fidelity. In continuous wave (CW) plasma, the effect of leveraging the chemical structure of the precursor has comparable results as the effect of the precursor mixture. It has been shown that the correlation between the $CF_2$ fraction in the precursor gas and in the deposited film surface chemistry is less than the correlation between the $CF_2$ fraction in the precursor gas and in the plasma gas phase obtained from optical emission spectroscopy. It has also been suggested that the effect of leveraging the content or molecular structure in hydrofluorocarbon (HFC) precursor is similar in effect to that of fluorocarbon (FC) precursor gas mixing with hydrogen additives. Recently, FC-assisted ALE using $C_4F_8$ and $CHF_3$ on $SiO_2$ and Si etching, and using $C_4F_8$ and $CHF_3$ on $Si_3N_4$ etching, indicate that the chemical structure of a precursor has an influence on the fluorine and carbon content deposited on the surface. The $CHF_3$-based ALE resulted in a higher fluorination level on the $Si_3N_4$ surface than $C_4F_8$, which is different from the observations in CW plasma. $CH_3F$-based ALE of $Si_3N_4$ has been investigated and exhibit ALE selectivity of $Si_3N_4$ over Si. However, the potential for further improving the performance of ALE, such as improving etch selectivity, through modifications in chemical composition and/or structure of the chemical precursor, has not been established and is still not well characterized or understood.

SUMMARY

According to an aspect of the invention, provided is a method of selectively etching a substrate including at least one cycle of: depositing a chemical precursor on a surface of the substrate to form a chemical precursor layer on the substrate, the substrate including a first portion and a second portion, wherein the first and the second portion are of a different composition; selectively removing the chemical precursor layer and at least a part of the first portion of the substrate; and repeating the cycle until the first portion of the substrate is substantially or completely removed, wherein deposition of the chemical precursor and selective removal of the chemical precursor layer and at least a part of the first portion of the substrate are performed under a plasma environment.

According to another aspect of the invention, provided is a method of atomic layer etching including at least one cycle of: depositing a chemical precursor including fluorine on a surface of a first portion of a substrate to form a fluorocarbon film on the surface of the first portion of the substrate, the substrate including the first portion on a second portion of the substrate, wherein the first and the second portion are of a different composition; selectively removing the fluorocarbon film and at least a portion of the first portion of the substrate; and repeating the cycle until the first portion of the substrate is substantially or completely removed, wherein deposition of the chemical precursor and selective removal of the fluorocarbon film and at least a part of the first portion of the substrate are performed under a plasma environment.

According to another aspect of the invention, provided is a method of selectively etching a substrate including at least one cycle of: depositing a hydrofluorocarbon on an $SiO_2$ first portion of the substrate to form a hydrofluorocarbon film on the surface of the substrate, the substrate including the $SiO_2$ first portion on an c-Si, Si, $Si_3N_4$ or SiGe second material layer; selectively removing the hydrofluorocarbon film and at least a part of the $SiO_2$ first portion; and repeating the cycle until the $SiO_2$ first material, layer of the substrate is substantially or completely removed, wherein deposition of the hydrofluorocarbon and selective removal of the $SiO_2$ first portion of the substrate are performed under a plasma environment including Argon (Ar).

BRIEF DESCRIPTION OF THE DRAWINGS

FIGS. 1(a) and 1(b).

FIGS. 2(a) and 2(b).

FIGS. 3(a)-3(l) illustrate $Si_3N_4$ XPS spectra obtained at a take-off angle of 20° that compare surfaces after ALE using: FIGS. 3(a)-3(c) $C_4F_8$; FIGS. 3(d)-3(f) $C_4F_8/H_2$; and FIGS. 3(g)-3(i) $C_3H_3F_3$ precursors at the end of deposition and etching steps, respectively. XPS difference spectra formed by subtracting XPS data after the etching step from the data after the deposition step are also shown for the three chemistries ($C_4F_8$, $C_4F_8/H_2$, and $C_3H_3F_3$). The spectra include; FIG. 3(j) $Si_2p$; FIG. 3(k) C1s; and FIG. 3(l) F1s.

FIGS. 4(a) and 4(b).

FIGS. 5(a) and 5(b).

DETAILED DESCRIPTION

The foregoing and other aspects of the present invention will now be described in more detail with respect to other embodiments described herein. It should be appreciated that the invention can be embodied in different forms and should not be construed as limited to the embodiments set forth herein. Rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Additionally, as used herein, the term "and/or" includes any and all combinations of one or more of the associated listed items and may be abbreviated as "/".

Unless otherwise defined, all technical and scientific terms used herein have the same meaning as commonly understood by one of ordinary skill in the art to which this invention belongs.

According to embodiments of the invention, highly selective atomic layer etching (ALE) of semiconductor materials can be provided using, in some embodiments, hydrofluorocarbon (HFC) precursors.

The term atomic layer etching, as used herein, can broadly refer to the level of layer dimensional control that can be achieved at the angstrom (Å) level. Thus, atomic layer etching may generally correspond to the size of atoms. Additionally, the average removed layer thickness/cycle can be less than 1 Å per etching cycle, or more than 1 Å per cycle, for example, about 3 Å, about 2 Å, about 3 Å, about 4 Å, about 5 Å, about 6 Å, about 7 Å, about 8 Å, about 9 Å, about 10 Å nm), about 11 Å, about 12 Å, about 13 Å, about 14 Å, about 15 Å, about 16 Å, about 17 Å, about 18 Å, about 19 Å, about 20 Å (2 nm), about 2.5 nm, or about 3 nm per cycle.

Although the following discussion mainly focuses on the hydrofluorocarbon or fluorocarbon, the concept can be applied to other precursors, including complex compounds that contain chlorine, boron trichloride, bromine, oxygen, ammonia and others employed in a plasma etching process. The methods of generating plasma are not limited to the inductively coupling plasma (ICP), for example conductive coupling plasma (CCP), helical plasma or electron cycle resonance (ECR) plasma may also be adopted to methods of the present invention. In some embodiments, the generated plasma and the plasma environment used in the plasma etching process according to methods of the present invention is a plasma including Argon (Ar), for example, such as a steady-state Ar plasma generated in an inductively coupled plasma (ICP) reactor.

The term substrate, as used herein, can broadly refer to any layer upon which processing is desired. Thus, for example, a native oxide film on the surface of a silicon substrate may itself be considered a substrate for the purposes of this discussion. Likewise, layers deposited on silicon or on other base substrates may likewise be considered substrates in some embodiments. For example, in some embodiments, a multi-layer stack may be formed, and then atomic layer etching may be performed on the top layer of the stack. In such a case, the top layer may be considered the substrate. In general, the layer or layers upon which the chemical precursor is deposited and/or which reacts with the chemical precursor can be considered the substrate layer(s).

Various substrates may be used in studying and evaluating the use of cyclic plasma interacting with the substrate. For example, such substrates may include materials that show chemically enhanced etching in the presence of low energy bombardment and a chemical precursor. The substrates can also include at least one of $SiO_2$, $Si_3N_4$, Silicon (Si) amorphous Si, crystalline Si (c-Si), monocrystalline. Si, polycrystalline Si, $Si_xGe_{1-x}$, GaAs or other group III-V semiconductors, $GaAl_xAs_{1-x}$, InGaAs, $GaP_xAs_{1-x}$, or the oxides, nitrides, or oxynitrides of any of the above listed substrate materials, or like materials other than those listed above. Additionally, the substrate may have a native oxide layer on the surface of the substrate. Moreover, a thickness of the native oxide layer may vary. For example, the thickness of the native oxide layer may be about 1/10 of 1 nm (1 Å) to about 10 nm. In some embodiments, the substrate can include $SiO_2$, and at least one of Si, c-Si, $Si_3N_4$ and/or SiGe. Ln other embodiments, the substrate can include $SiO_2$, and at least one of Si and/or $Si_3N_4$. In some embodiments, the substrate can include $SiO_2$, and $Si_3N_4$. In other embodiments, the substrate can include $SiO_2$, and Si. In other embodiments, the substrate may include an $SiO_2$ layer on a layer including: at least one of Si, c-Si, $Si_3N_4$ and/or SiGe; Si and/or $Si_3N_4$; $Si_3N_4$; and Si. In some embodiments, the substrate may include an $SiO_2$ layer on a $Si_3N_4$ layer. In other embodiments, the substrate may include an $SiO_2$ layer on an Si layer.

The substrate, according to other embodiments, may include, but are not limited to, wafers. The wafers may be of various suitable processing sizes. For example, substrate samples may be on the order of 1 inch or smaller, if desired. Additionally, full wafers of about 200 mm or about 300 mm in diameter, or even larger substrates may be incorporated.

According to some embodiments, angstrom or angstroms (Å) thick precursor layers can be provided/deposited on a surface layer of a substrate. For example, HFC, or fluorocarbon (FC), chemical precursor layers can be deposited to a thickness of about 1 Å, 2 Å, 3 Å, 4 Å, 5 Å, 6 Å, 7 Å, 8 Å, 9 Å, 10 Å (1 nm), 1.5 nm, 2 nm, 2.5 nm, to about 3 nm on a surface layer to form a modified surface layer, for example, such as a modified $SiO_2$ surface layer. In some embodiments, the thickness of the chemical precursor, layers should be of sufficient thickness to provide an etch selectivity between substrate materials, for example $SiO_2$ to $Si_3N_4$ or $SiO_2$ to Si. In some embodiments, the thickness of the precursor layer is at least about 7 Å, about 10 Å, about 15 Å, about 20 Å to about 3 nm. The stoichiometry of the HFC or FC precursor layers is variable, and they may include other elements not specifically called out, such as, for example, H. Subsequently, after establishing a gaseous environment of sufficient purity, such as, for example, by maintaining an Ar environment without additional precursor injection, low energy $Ar^+$ ion bombardment can be applied to remove portions of the precursor layer, portions of the reacted surface layer, and controlled portions of the surface layer. This may be followed by another period during which an Ar gaseous environment of sufficient purity is established. Such a process can be repeated in a cyclical manner until a desired overall etching depth has been achieved. Further, low energy ion bombardment can be applied in various eV ranges, such as, for example, within a range of about 0 eV up to about 100 eV. In other embodiments, gases such as Ar, including Ne and/or Xe may also be applied.

The term "fluorocarbon" (FC) may refer to an organofluorine compound containing only fluorine and carbon, such as a perfluorocarbon, perfluoroalkane, perfluoroalkene, and the like, however, is not strictly limited thereto, and may refer to, in some embodiments, a hydrocarbon in which some or all C—H bonds have been replaced by C—F bonds. An example of a hydrocarbon in which some C—H bonds have been replaced by C—F bonds, is a hydrofluorocarbon (HFC), such as $CHF_3$, $C_3H_3F_3$, or any $C_kH_mF_n$, or isomers thereof.

An ALE cycle may include a deposition step in which a precursor is injected into a reactor containing the substrate, such as an ion coupled plasma (ICP) reactor, for a period of time, for example, 1 s, for depositing thinner precursor film layers, such as a 5 Å precursor film layer, or 2 s, for depositing thicker precursor film layers, such as a 10 Å precursor film layer, on the substrate, followed by a purge step to pump out residual reactive gas. In some embodiments, the purge step is about 12 s. The purge step is followed by an etching step performed by applying, for example, an RF bias voltage for a predetermined length of time, as will be further described below.

Material etching can stop once the reacted surface layer and/or a portion of the surface layer has been removed, resulting in a self-limited process. Thus, according to some embodiments, development of atomic layer etching processes for complex materials may be feasible.

In some embodiments, various precursors may be applied in ALE. For example, applicable precursors may include oxygen gas and fluorocarbon gas, such as, for example, FC precursors such as $C_4F_8$, $C_4F_6$, or $CF_4$. In some embodiments. HFC precursors, such as $CHF_3$, $C_3F_3H_3$, any $C_kH_mF_n$, or isomers thereof, may be applied. In some embodiments, k, m, and n of chemical formula $C_kH_mF_n$ are each independently, an integer between, and including, 1 and about 6 for k, and an integer between, and including, 1 and about 2k+1 for m and n, respectively. In some embodiments, k is an integer between, and including, 2 and 4. In some embodiments, n is an integer between, and including, k and 2k+1. In some embodiments, n=m. Additionally, in some embodiments, $Cl_2$ or at least one Br-based gas alone, or in combination with fluorocarbon gases may also be applied. Moreover, in other embodiments, the precursor may include at least one of $CHF_3$, $C_3F_3H_3$, $C_kH_mF_n$ gas precursors or isomers thereof, or any $C_pO_qF_r$ gas precursors or isomers thereof, either alone or with admixtures of $N_2$, $H_2$, $O_2$, CO, $CO_2$, noble gases, or $SiF_4$, either alone or in any combination thereof. In some embodiments, the precursor, such as an HFC precursor, may be a reactive precursor having, a complex structure, that significantly retains reactive precursor structure during ion bombardment/CW plasma etching processes in the ALE of the present invention. In some embodiments, the precursor used for ALE, for example, an HFC precursor, minimizes ion bombardment of a substrate layer on which the precursor is deposited.

Accordingly, in some embodiments, the precursor may be a hydrofluorocarbon (HFC) having a reduced F/C ratio. The F/C ratio for a precursor may be expressed by Equation I, $$F/C\ ratio = (F-H)/C \quad (I)$$

wherein F is the number of fluorine atoms, H is the number of hydrogen atoms, and C is the number of carbon atoms in the precursor. In some embodiments, the precursor may have a reduced F/C ratio of about 0 (F≈H) or equal to 0 (F=H). In other embodiments, the precursor may have 2, 3 or 4 carbons. Exemplary RFC precursors having a reduced F/C ratio of 0 and having 2, 3, or 4 carbons are listed in Table 1.

TABLE 1

Molecular formula of precursor, name, and structure for various HFC precursors having a reduced F/C ratio of 0.

| Molecular Formula | Name | Structure |
|---|---|---|
| $C_4H_4F_4$ | (E)-1,1,1,3-tetrafluoro-2-butene | $F_3C-CH=CF-CH_3$ |
| $C_4H_4F_4$ | (Z)-1,1,1,3-tetrafluoro-2-butene | $F_3C-CH=CF-CH_3$ |
| $C_4H_4F_4$ | 2,4,4,4-tetrafluoro-1-butene | $CH_2=CF-CH_2-CF_3$ |
| $C_3H_3F_3$ | 2,3,3-trifluoropropene | $H_2C=CF-CF_2H$ |
| $C_3H_3F_3$ | 3,3,3-trifluoropropene | $H_2C=CH-CF_3$ |
| $C_3H_3F_3$ | 1,1,3-trifluoroprop-1-ene | $F_2C=CH-CH_2F$ |
| $C_3H_3F_3$ | 1,2,3-trifluoroprop-1-ene | $HC(F)=CF-CH_2F$ |
| $C_3H_3F_3$ | 1,3,3-trifluoroprop-1-ene | $HC(F)=CH-CF_2H$ |
| $C_2H_3F_3$ | 1,1,1-trifluoroethane | $F_3C-CH_3$ |
| $C_2H_3F_3$ | 1,1,2-trifluoroethane | $HF_2C-CH_2F$ |

In some embodiments, the HFC precursor having a reduced F/C ratio can be 3,3,3-trifluoropropene.

To realize HFC or FC precursor layer deposition on the order of an angstrom or angstroms in thickness, a pulsed HFC or FC precursor injection into a low power Ar plasma may be used. For example, in some embodiments, a pulsed HFC or FC injection into a low power Ar plasma may be used. For an unbiased substrate, precise HFC or FC film thickness control in the about 1 Å, 2 Å, 3 Å, 4 Å, 5 Å, 6 Å, 7 Å, 8 Å, 9 Å, 10 Å (1 nm), 1.5 nm, 2 nm, 2.5 nm, to about 3 nm range may be possible by adjusting the total number N of HFC or FC molecules entering the reactor of a plasma system by varying pulse duration and HFC or FC gas flow rate appropriately. For these conditions, HFC or FC film thickness may increase linearly with N.

Following chemical precursor deposition, an etching step may be performed in which a small radio frequency (RF) self-bias voltage may be applied for a predetermined length of time. For example, in certain embodiments, a small RF self-bias voltage of −5, −10, −15, −20, −25, −30, −35, −40, −45 and/or −50 V may be applied. As a result, maximum ion energies of 20, 25, 30, 35, 40, 45, 50, 55, 60 and/or 65 eV, respectively, may be created. The small RF self-bias voltage may be applied for an etching step length (ESL) of, for example, about 15 s, about 18 s, about 20 s, about 25 s, about 30 s, or about 35 s. For the low maximum ion energies, $Ar^+$ ion induced physical, sputtering of unmodified surface material may be negligible. At the end of a cycle, the process sequence may be repeated to achieve precise control over the total etched thickness. Any number of cycles, for example, from 1 to about 5, 10, 15, 20, 25, or 30, or more, cycles, may be performed in the ALE procedure described herein.

To carry out ALE procedures, according to some embodiments, various plasma systems may be used. For example, in some embodiments, an inductively coupled plasma system may be used. In other embodiments, the plasma system may include capacitively coupled plasma systems, electron cyclotron resonance plasma systems, Helicon wave plasma systems, and electron-beam generated plasma systems. The plasma systems may also include magnetic enhancements and controllers configured to control an amount of chemical precursor deposition, and to control the removal of portions of the chemical precursor layer(s), modified surface layer(s), and controlled portion of the substrate.

The plasma system may be excited at various frequencies, both high and low. For example, according to some embodiments, the plasma system may be excited at, for example, 13.56 MHz. The substrate may be biased at a radiofrequency of, for example, 3.7 MHz. The base pressure achieved before processing may be in various ranges, such as, for example, the $1\times10^{-7}$ Torr range, and the temperature of the samples may be stabilized by substrate cooling during plasma processing at, for example, 10° C.

Various materials may also be used with the plasma system. For example, $SiO_2$—Si—$SiO_2$ or $SiO_2$—$Si_3N_4SiO_2$ stacks deposited on an Si substrate may be used. The stacks may be deposited on the Si substrate by plasma-enhanced chemical vapor deposition (PECVD), or any other technique as would be appreciated by one of skill in the art, and studied by, for example, in-situ ellipsometry in real time. In other embodiments, any of the other various substrate materials described above may also be used.

Controlled deposition and chemical modification of the surface may allow selective removal of a sub-nm layer of a material layer, wherein selective removal may be represented in terms of the material that is removed under the precursor layer, which may be modified prior to, or is modified during, the removal process. To establish strongly-time-dependent etch rates, a sequential approach may be used including a thin HFC or FC precursor layer deposition followed by a low energy $Ar^+$ ion etch for selective removal of volatile material.

In order to exhibit etch selectivity, in some embodiments, assisted plasma ALE may selectively remove a first material layer/portion of a substrate, with minimal removal/loss of a second material layer/portion of the substrate, for example, an ALE which removes a first material layer, for example, an $SiO_2$ layer stacked upon a second material layer, for example, an $Si_3N_4$ or Si layer, in which little of or none of the second material layer is removed/lost in the process. In some embodiments, removal or thickness loss is less than about 5 Å, about 4 Å, about 3 Å, about 2 Å or less than about 1 Å of the second material layer/portion.

In some embodiments, control of ALE etch selectivity may be achieved by a combination of both increased HFC or FC layer thickness, a shorter ESL, and a low RF bias voltage. For example, in some embodiments, a combination of depositing an about 10 Å thick HFC or FC precursor layer, an ESL of about 18 s, and a −15 V RIF bias voltage that generates, for example, Anions with a maximum energy of about 30 eV, may be used for selective ALE, according to some embodiments.

An exemplary method of ALE may be, according to some embodiments, as follows, the method may include, I) coupling a plasma system to deposit the controlled amount of the chemical precursor. The method may also include, II) depositing a controlled amount of a chemical precursor on a surface layer of a substrate to create a chemical precursor layer and/or a modified surface layer. The method may further include, III) establishing a gaseous environment of sufficient purity. In certain embodiments, this can be done, in some embodiments, by maintaining an Ar environment without additional precursor injection. The method may also include, IV) controlling a rate of selectively removing the portion of the chemical precursor layer and/or a portion of the modified surface layer, and a controlled portion of the substrate.

The method may also include, V) applying a bias potential to the substrate at a level configured to increase ion energies. The method may further include, VI) selectively removing a portion of the chemical precursor layer, a portion of the modified surface layer, and a controlled portion of the substrate in a cyclical process. The method may also include, VII) again establishing an Ar gaseous environment of sufficient purity. Once an Ar gaseous environment of sufficient purity is again established, the method may be repeated as a cyclical process beginning again from II), until a desired overall etching depth is achieved, or a desired amount of the substrate or a material layer on the substrate is removed. In some embodiments, most of or a substantial portion of a material layer etched using the ALE method is removed, i.e., the material layer is substantially removed, such as more than 80%, removed, more than 90% removed, and more than 95% removed, or more than 98% removed. In some embodiments, a material layer etched using the ALE method is completely removed, i.e., none of the material layer remains after etching. If desired, variations on pulse length, precursor thickness and/or etching step length (ESL) can vary from cycle to cycle. Thus, it is not required that all cycles be identical. However, in certain embodiments, the cycles may be identical if desired.

Plasma systems in which the methods of the invention may take place, as well as controllers for such systems, include, in some embodiments: systems, including coupled plasma systems; and controllers, such as a computer-implemented controller including a processor and memory, such as is described in U.S. Pat. No. 9,620,382, the content of which is incorporated by reference herein in its entirety.

Having described various aspects of the present invention, the same will be explained, in further detail in the following examples. Much are included herein for illustration purposes only, and which are not intended to be limiting to the invention.

EXAMPLES

These examples below compare the ALE selectivity of $SiO_2$ over $Si_3N_4$ and $SiO_2$ over Si using (1) an FC precursor, $C_4F_8$, (2) a mixture of an FC precursor and $H_2$, $C_4F_8/H_2$, and (3) an HFC precursor, $C_3H_3F_3$. The detailed information regarding the chemical structure of the precursors used for this study is shown in Table 2. The experimental tests targeted ALE selectivity of $SiO_2$ over $Si_3N_4$ and $SiO_2$ over Si. The precursor deposited film thickness per cycle is designed to be thick enough to form a passivating layer on $Si_3N_4$ or Si, whereas the relatively higher carbon consumption rate of $SiO_2$ leads to negligible film thickness on $SiO_2$. Stacked $SiO_2$—$Si_3N_4$—$SiO_2$ and $SiO_2$—Si—$SiO_2$ on Si substrates were used. The material thickness loss after fully etching the top $SiO_2$ layer before forming a passivation layer and stopping etch was used to evaluate the ALE selectivity for different precursors. The first part discusses the ALE behavior of $SiO_2$ and $Si_3N_4$ and the corresponding $Si_3N_4$ thickness loss before the formation of an etch-stopping FC passivation layer. To study the correlation between the chemical structure of the precursor and the surface chemistry evolution, x-ray photoelectron spectroscopy (XPS) analysis of the materials at the end of two ALE process steps in one cycle, i.e., the FC deposition step and the etching step, was performed. In the second part, $SiO_2$ and Si etching were studied using an identical set of precursors and Si thickness loss before etch stop was determined.

TABLE 2

Molecular formula of precursor, name and structure for the precursors used.

| Molecular Formula | Name | Structure |
|---|---|---|
| $C_4F_8$ | octafluorocyclobutane | $F_2C$—$CF_2$ <br> \|     \| <br> $F_2C$—$CF_2$ |
| $C_3H_3F_3$ | 3,3,3-trifluoropropene | $H_2C$=CH—$CF_3$ |

EXPERIMENTAL

The experimental setup is briefly described here. An inductively coupled plasma (ICP) reactor was used and excited at 13.56 MHz. The substrate was biased at the radiofrequency (RF) of 3.7 MHz. The plasma was confined within a 195 mm diameter anodized Al confinement ring. A 125 mm diameter Si substrate was located 150 min below the top electrode on an electrostatic chuck. The base pressure before processing was in the $1 \times 10^{-7}$ Torr range, and the temperature of the $25 \times 25$ mm$^2$ sample was stabilized by a cooled chuck at 10° C. during plasma processing. A load lock and vacuum transfer were used for all experiments in order to minimize environmental impacts during the sample exchange. The detailed configuration of the plasma system can be found in Standaert et al., J. Vac. Sci. Technol. A 17, 741 (1999) and Engelmann et al., J. Vac. Sci. Technol. B 25, 1353 (2007). Before each experiment, an $O_2$ plasma-based cleaning process and Ar plasma-based conditioning process were employed to ensure that the condition of the reaction chamber remained consistent. Two sets of multilayer stacked samples: (1) $SiO_2$—Si—$SiO_2$ and (2) $SiO_2$—$Si_3N_4$—$SiO_2$ deposited on a Si substrate enabled evaluation of etching selectivity of $SiO_2$ over Si and $SiO_2$ over $Si_3N_4$. The in situ ellipsometry with a He—Ne laser on the ICP reactor allowed for studying material thickness changes in real time.

The ALE experiments were performed following the FC assisted ALE procedure that is based on the use of a steady-state Ar plasma in conjunction with periodic injections of a defined number of precursor gases and synchronized plasma based Ar ion bombardment. The process sequence is as follows. All plasma processes presented in this work operate with a source power of 200 W and a processing pressure of 10 mTorr along with a 50 sccm Ar carrier gas flow rate. The ALE process is comprised of a deposition step and an etching step. In the deposition step, a selected precursor was introduced with an injection length of 2 s to deposit a 10 Å thick FC film on the substrate. This step was followed by a 12 s purge step to pump out the residual reactive gas. In the etching step, a 15 V RF bias voltage was employed with an etching step length (ESL) of 18 s, accelerating energetic Ar ions with a maximum kinetic energy of 30 eV to sputter the deposited FC film and reacted layer. The process conditions of the deposition and etching steps are optimized to obtain a good ALE selectivity of $SiO_2/Si_3N_4$ and Si by using the $C_4F_8$ precursor. Since the deposition yield may be different for each material, the experiment was set to deposit a 10 Å thick FC film on $SiO_2$ at the beginning cycles and keep a fixed amount of precursor injection during the following cycles. Three sets of precursors were explored, i.e., (1) 2 sccm $C_4F_8$, (2) 2 sccm $C_4F_8$ mixing with 3 sccm $H_2$, and (3) 2 sccm $C_3H_3F_3$.

To establish surface chemistry modification with regard to precursor chemistry and structure, XPS analyses have been performed at the end of the deposition and etching steps. The samples were transferred under vacuum to a Vacuum Generators ESCALAB MK II surface analysis system for XPS measurements. High resolution scans of the Si2p, C1, O1s, N1s, and F1s spectra were obtained at 20 eV pass energy at an electron take-off angle of 20° (shallow probing depth≈20-30 Å) and 90° (deep probing depth≈80 Å) with respect to the sample surface. The spectra were calibrated by the binding energy position of the C—C peak to 284.5 eV and fitted using a least square fitting after Shirley background subtraction.

RESULTS

A. $SiO_2$ and $Si_3N_4$ ALE

Figures 1A, 1B:
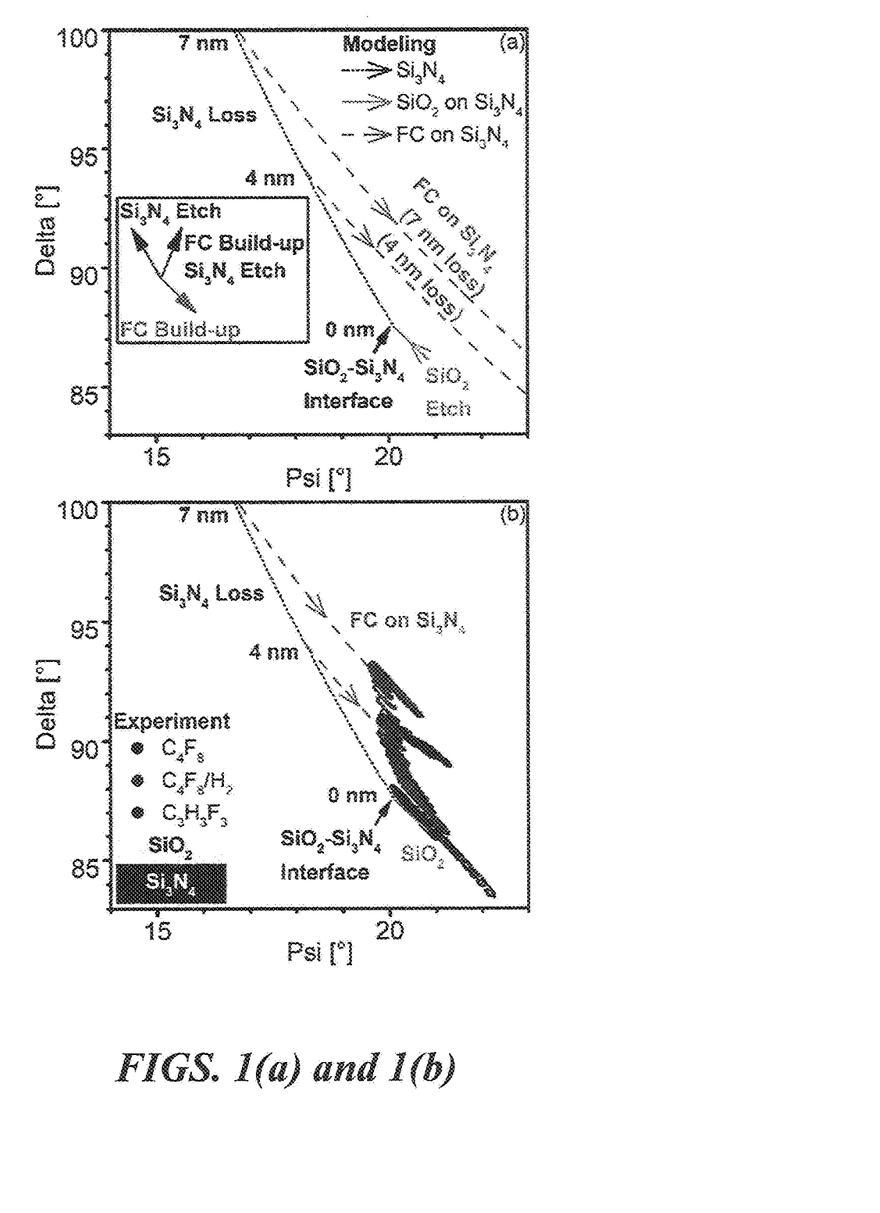
FIG. 1(a) illustrates ellipsometry modeling for $SiO_2$—$Si_3N_4$—$SiO_2$ stack sample with top $SiO_2$ etching (solid arrow, bottom $SiO_2$ layer is not shown) and underlayer $Si_3N_4$ etching (short dotted line). The dashed line describes the formation of a FC passivation layer with 4 and 7 nm $Si_3N_4$ loss before etch stop.
FIG. 1(b) illustrates the experimental in situ ellipsometry data of ALE with $C_4F_8$, $C_4F_8/H_2$, and $C_3H_3F_3$ superimposed on the ellipsometry model. The figure shows various $Si_3N_4$ losses by using different precursors and essentially negligible $Si_3N_4$ loss in the case of $C_3H_3F_3$.

An in situ ellipsometry model in the Delta-Psi space was formulated to simulate the top $SiO_2$ and $Si_3N_4$ etching with corresponding accumulated FC film on the surface. This is shown in FIG. 1(a). The solid arrow describes top $SiO_2$ etching, and the short, dotted line describes etching of the $Si_3N_4$ underlayer. The process condition is designed for etching top $SiO_2$ followed by etch stop on $Si_3N_4$ by formation of a FC passivation layer on the surface. The dashed lines in FIG. 1(a) simulate the formation of the FC film with a given $Si_3N_4$ loss, such as 4 and 7 nm, which is used for evaluating the ALE selectivity.

The in situ ellipsometry data of ALE using $C_4F_8$, $C_4F_8$, $C_4F_8/H_2$, and $C_3H_3F_3$ on an $SiO_2$—$Si_3N_4$—$SiO_2$ stack sample were superimposed on the modeling results [FIG. 1(b)]. The ALE process conditions were the same as described in the beginning of this section, i.e., 10 Å FC deposition thickness per cycle on $SiO_2$, 18 s ESL, and 15 V RF bias voltage that creates Ar ions with a maximum energy of 30 eV. The black dots describe the $C_4F_8$-based ALE that removes the top $SiO_2$ layer and gradually accumulates a FC film during the $Si_3N_4$ etching region. Etching of $Si_3N_4$ stops once the accumulated film is thick enough to prevent further erosion of the $Si_3N_4$ underlayer. The corresponding $Si_3N_4$ loss is used to represent ALE selectivity using $C_4F_8$. The $C_4F_8/H_2$ ALE data show that the top $SiO_2$ layer is also completely removed and a FC passivation layer forms with more $Si_3N_4$ consumption in comparison to $C_4F_8$ ALE. Other $C_4F_8/H_2$ ratios including 2/1 and 2/2 sccm were examined, and the experimental results show that any hydrogen additive with $C_4F_8$ degrades the ALE selectivity of $SiO_2$ over $Si_3N_4$. On the other hand, $C_3H_3F_3$-based ALE shows a quick formation of a FC passivation layer with negligible $Si_3N_4$ thickness loss after top $SiO_2$ etching. Each of these three precursors enabled continuous ALE of $SiO_2$ and accumulated FC passivation on the $Si_3N_4$ surface that prevents further $Si_3N_4$ loss.

Figures 2A, 2B:
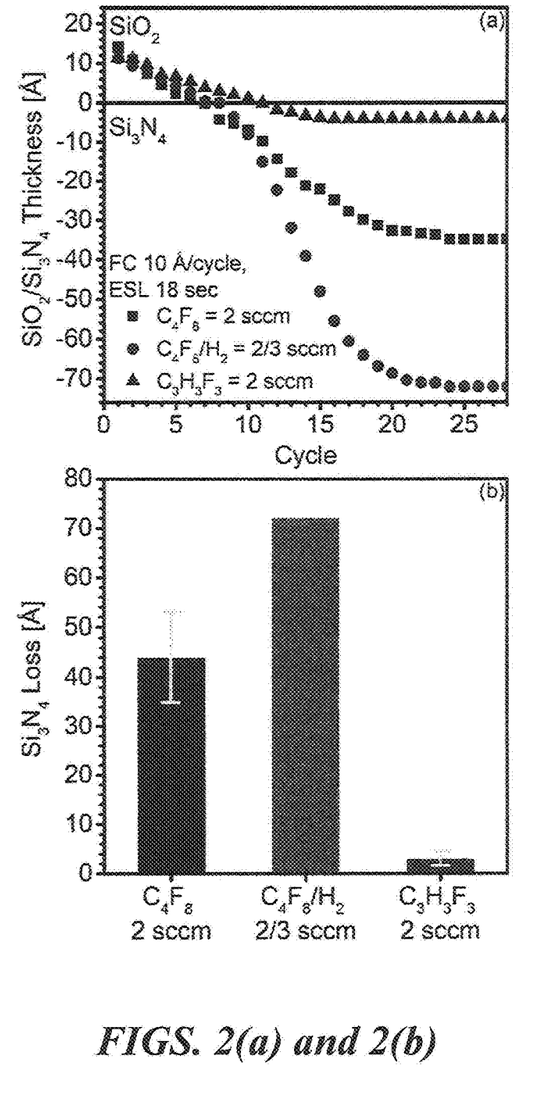
FIG. 2(a) illustrates $SiO_2$ and $Si_3N_4$ layer thickness at the end of each ALE cycle using $C_4F_8$, $C_4F_8/H_2$ and $C_3H_3F_3$, respectively. $Si_3N_4$ etching stops at various thicknesses.
FIG. 2(b) illustrates the amount of $Si_3N_4$ thickness loss before etching stops for three conditions.

The $SiO_2$ and $Si_3N_4$ layer thickness at the end of each cycle using $C_4F_8$, $C_4F_8/H_2$ and $C_3H_3F_3$ ALE is shown in FIG. 2(a). The ellipsometry model shown in FIG. 1(a) was applied to fit the experimental in situ ellipsometry data and measure the $SiO_2$ and $Si_3N_4$ thickness change. For $SiO_2$ etching, $C_4F_8$ and $C_4F_8/H_2$-based ALE gave higher $SiO_2$ thickness etched per cycle (EPC) than $C_3H_3F_3$. $Si_3N_4$ EPC showed a strong dependence on the gaseous precursor used for ALE. $C_4F_8$ mixing with $H_2$ exhibited the highest $Si_3N_4$EPC, followed by $C_4F_8$ and $C_3H_3F_3$. The use of a $C_3H_3F_3$-based ALE process shows minimum $Si_3N_4$ loss by rapid formation of a FC passivation layer, whereas the $C_4F_8/H_2$ mixture using identical process condition increases $Si_3N_4$ material loss. A comparison of the amounts of net $Si_3N_4$ loss for $C_4F_8$, $C_4F_8/H_2$, and $C_3H_3F_3$-based ALE at the end of the 28th cycle, when $C_3H_3F_3$-based ALE obtained a full etch stop, is shown in FIG. 2(b). $C_4F_8$, $C_4F_8/H_2C_3H_3F_3$-based ALE gave 37, 70 and 4 Å $Si_3N_4$ loss, respectively.

To evaluate surface chemical aspects of these processes, XPS spectra for $Si_3N_4$ ALE using $C_4F_8$, $C_4F_8/H_2$, and $C_3H_3F_3$ at the end of the deposition and etching steps were obtained. Scans were performed at the beginning of $Si_3N_4$ etching after the removal of the top $SiO_2$ layer, for example, the 8th cycle for $C_4F_8$, the 9th cycle for $C_4F_8/H_2$ and the 12th cycle for $C_3H_3F_3$ its FIG. 2(a). The data shown in FIG. 3 summarize the Si2p, C1s, and F1s spectra for the set of precursors. XPS intensity difference spectra corresponding to XPS data after etching and deposition steps, respectively, are shown. The Si2p spectra were fitted using fluorinated silicon nitride (Si—NT) and fluorinated silicon oxide (Si—OF) at 102.4 and 104.2 eV, respectively. The C1s spectra were fitted using C—C/C—H. C—$CF_x$, C—F/C—O, C—$F_2$, and C—$F_3$ at 284.5, 286.2, 287.9, 290.2, and 292.6 eV, respectively. The F1s spectra were decomposed into F—SiON and F—C at 686.8 and 687.8 eV, respectively. XPS intensity differences between after etching and deposition data for $C_4F_8$, $C_4F_8/H_2$ and $C_3H_3F_3$ were evaluated to clarify the extent of surface reaction by Ar ion bombardment. The spectra were normalized by the total areal intensity of all elements corrected with the relative sensitivity factors on the surface, including Si2p, C1s, N1s, O1s, and F1s.

Figure 4A:
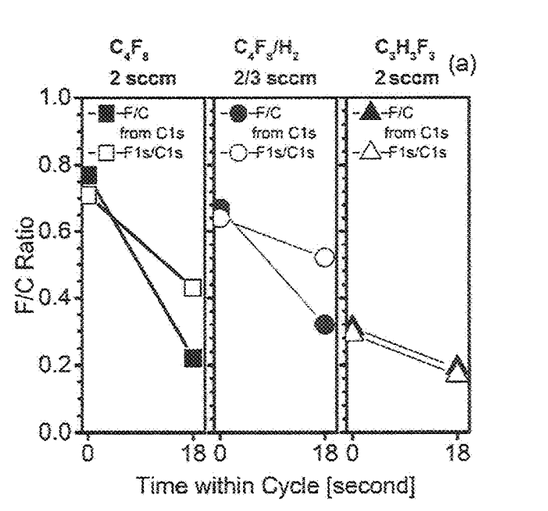
FIG. 4(a) illustrates a comparison of the F/C ratios from the C1s and F1s/C1s spectra with ALE using $C_4F_8$, $C_4/H_2$ and $C_3H_3F_3$ at the end of deposition and etching steps, respectively.
Figure 4B:
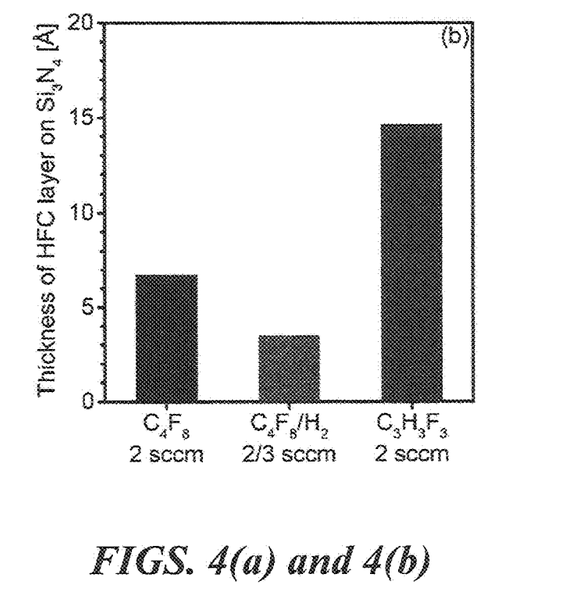
FIG. 4(b) illustrates the thickness of the HFC film remained on the $Si_3N_4$ surface at the end of etching step for the three precursors.

A comparison of the F/C ratios calculated from the C1s and F1s/C1s spectra at a take-off angle of 20° with $C_4F_8$, $C_4F_8/H_2$, and $C_3H_3F_3$-based ALE at the end of deposition and etching steps, respectively, is shown in FIG. 4(a). The F/C ratios from the C1s spectra measures the fluorine content in the deposited FC layer by calculating the area percentage of weighted C—F, $CF_2$ and $CF_3$ peaks in the spectra. The ratio of F1s/C1s spectra measures the fluorine content in both FC layer and underlying $Si_3N_4$. By observing the difference between the F/C ratios from the C1s spectra and F1s/C1s spectra, the fluorine reacted with the underlying $Si_3N_4$ was evaluated. FIG. 4(b) measures the thickness of the HFC film remained on the $Si_3N_4$ surface after the Ar ion bombardment by angle-resolved XPS (AR-XPS) using the Si2p signal attenuation obtained from 20° and 90° take-off angles.

The C1s spectra after FC deposition in FIG. 3(b) show that $C_4F_8$ leads to strong C F/C—O, C—$F_2$, and $CF_3$ peak intensity, whereas mixing $H_2$ with $C_4F_8$ in FIG. 3(e) produce surfaces that exhibit relatively low $CF_x$ peak intensity. Importantly, $C_3H_3F_3$ overall minimizes the $CF_x$ peak intensities, i.e., fluorine content, for the deposited HFC film shown in FIG. 3(h). The comparison of the F/C ratios from the C1s spectra after deposition step also shows that $C_4F_8$-based FC film has the highest fluorine content, followed by $C_4F_8/H_2$ and $C_3H_3F_3$ [FIG. 4(a)]. Since the ratio of F1s/C1s spectra is almost identical to the F/C ratios from the C1s spectra, most of the fluorine measured is from the deposited film and has not reacted with the underlying $Si_3N_4$. The C1s spectra and F/C ratios confirm that the precursor chemistry used for ALE controls the fluorine content in the deposited film. The results suggest that gaseous precursors with same degree of unsaturation or high F/C ratio can lead to fluorine-rich deposited FC films.

FC film defluorination and reacted material removal take place for $C_4F_8$, $C_4F_8/H_2$, and $C_3H_3F_3$-based ALE during the etch step. The C1s spectra show the intensity reduction of the C—Fx peaks in FIGS. 3(b), 3(e), and 3(h). The intensity of the C—C/C—H peak increase is related with the FC film defluorination during etching, since the release of fluorine from the film contributes to the formation of a carbon rich layer. $C_3H_3F_3$ showed a stronger C—C/C—H peak intensity after the etching step, implying that a carbon rich passivating layer remains on the surface in comparison to $C_4F_8$ and $C_4F_8/H_2$. The F/C ratio from the C1s spectra after etching step [FIG. 4(a)] also shows the reduction of the fluorine content in the deposited HFC film. At the same time, the etching step also reduces the deposited FC film thickness, so the underlying $Si_3N_4$ will be exposed more to the fluorine etchant, introducing fluorination and etching of the reacted $Si_3N_4$. The Si2p and F1s spectra after $C_4F_8$-based ALE [FIGS. 3(a) and 3(c)] exhibit increased Si—NF and Si—OF peak intensities after the etching step. The F/C ratios from the F1s/C1s spectra is relatively higher than the ratios from the C1s spectra after etching step [FIG. 4(a)] supports that the fluorine etchant reacts with the underlying $Si_3N_4$ and results in $Si_3N_4$ fluorination. With the confirmation from the AR-XPS FC thickness measurements [FIG. 4(b)], it was concluded that etching of the FC film and fluorination of the $Si_3N_4$ underneath takes place. Comparison of $C_4F_8$, $C_4F_8/H_2$ shows less remained HFC film and higher fluorination of the underlying $Si_3N_4$. Surfaces after $C_3H_3F_3$-based ALE show least etching of the FC layer and negligible fluorination of the underlying $Si_3N_4$.

Figures 3A, 3L:
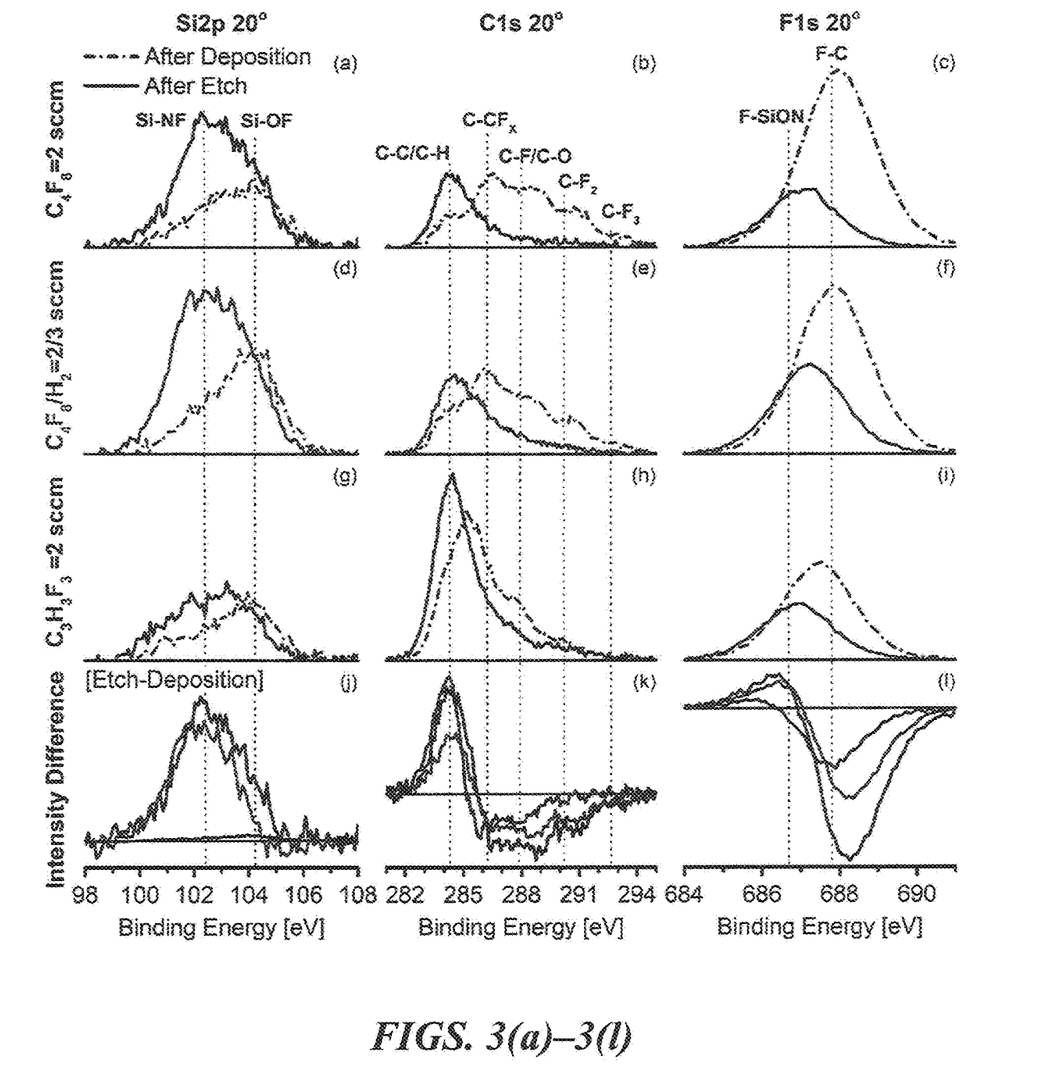

The XPS difference spectra after FC film deposition and etching for $C_4F_8$, $C_4F_8/H_2$ and $C_3H_3F_3$ were used to clarify the extent of surface reactions and are shown in FIGS. 3(j)-3(l). The spectra were normalized to the sum of the Si2p, C1s, N1s, O1s, and F1s areal intensities corrected with the relative sensitivity factors. The Cis difference spectra in FIG. 3(k) confirms that $C_3H_3F_3$-based ALE deposits contain the minimum amount of fluorine in the HFC film, whereas the use of $H_2$ reduces both the F/C ratio of the deposited film and overall amount of the FC layer as compared to $C_4F_8$. The fact that $H_2$ enhances the removal of the remaining FC film for the $Si_3N_4$ surface and causes less FC film coverage can be seen from the lowered intensity of the C—C/C—H peak.

The fluorination level of the underlying $Si_3N_4$ due to the fluorine etchant released from the deposited FC film as a result of Ar ion bombardment is mirrored by the areas of the Si—NF, Si—OF, and F—SiON peaks in the Si2p and F1s intensity difference spectra shown in FIGS. 3(j) and 3(l). In the F1s intensity difference spectra, $C_4F_8$ and $C_4F_8/H_2$ show strong fluorination on the underlying $Si_3N_4$, which is the reacted layer that will be etched in the etching step, whereas $C_3H_3F_3$ shows little SiON—F peak formation. The formation of the F—SiON peak in the F is spectra may be correlated with the $Si_3N_4$ loss before formation of a FC passivation layer and etch stop. Since Ar ion bombardment during the etching step causes removal of fluorinated products, the $Si_3N_4$ loss is positively correlated to the F—SiON peak area of the material. The XPS difference spectra qualitatively agree with the $SiO_2$ and $Si_3N_4$ thickness changes measured by ellipsometry. For $C_4F_8$ and $C_4F_8/H_2$-based ALE, more $Si_3N_4$ loss is required before a sufficiently thick FC passivating layer is established. The classical concept of gas mixing by combining $C_4F_8$ and $H_2$ does not reduce the material loss for FC-assisted ALE because of the strong loss of the surface passivation layer as a result of hydrogen induced etching of the FC film.

B. $SiO_2$ and Si ALE

Figures 5A, 5B:
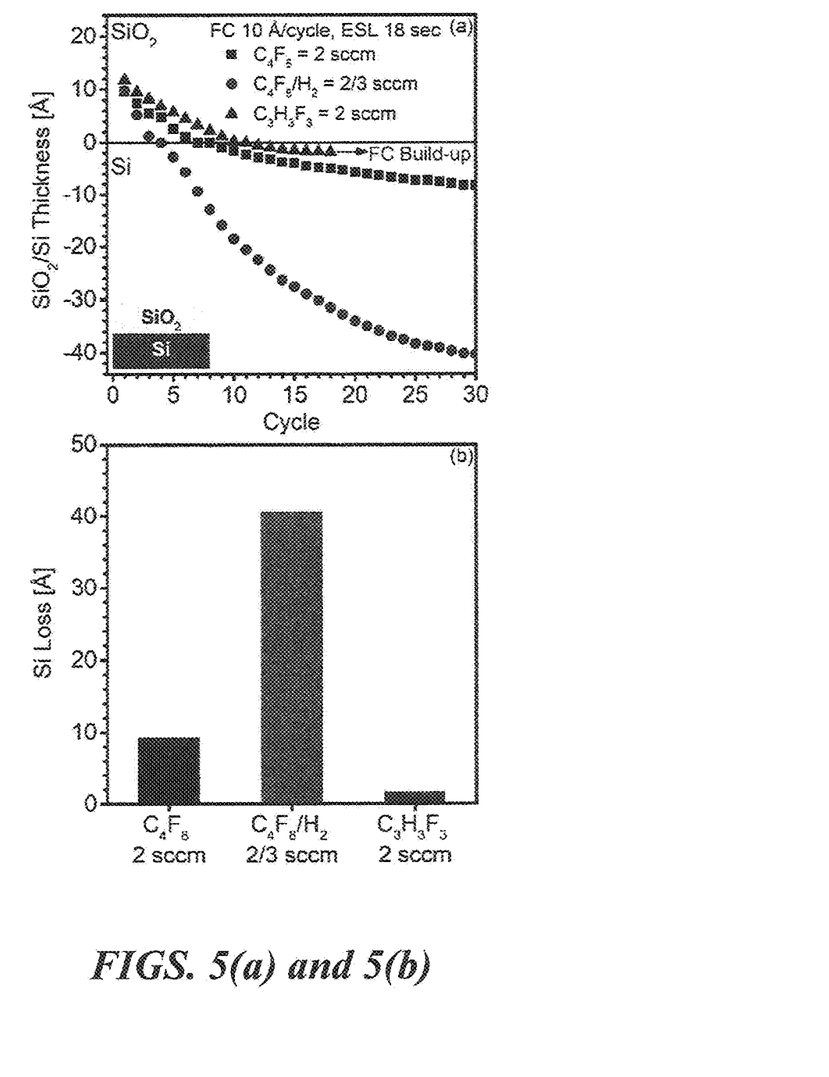
FIG. 5(a) illustrates $Si_2$ and Si thicknesses at the end of each ALE cycle using $C_4F_8$, $C_4F_8/H_2$ and $C_3H_3F_3$ precursors.
FIG. 5(b) illustrates precursor chemistry dependence of Si thickness loss prior to Si etch stop as the result of formation of a passivation layer.

Selective ALE of $SiO_2$ over a Si underlayer was examined using the identical set of precursors just discussed for $SiO_2$—$Si_3N_4$—$SiO_2$ stacks. Results for $SiO_2$—Si—$SiO_2$ stacks are shown in FIG. 5(a). For the FC assisted ALE based on $C_4F_8$, the Si thickness loss before establishing a sufficiently thick FC film to stop Si removal is about 9 Å. When $C_4F_8$ was mixed with $H_2$, a higher thickness EPC of $SiO_2$ and Si is observed, and the Si thickness loss increases to 40 Å at the 30th cycle. For $C_3H_3F_3$-based ALE, a comparable $SiO_2$ EPC to that when using $C_4F_8$ is observed. However, in this case, a reduced Si EPC is seen for $C_3H_3F_3$ once the process starts to etch Si. No more Si loss or Si EPC reduced to a negligible amount of less than 1 Å is observed after the 19th cycle. This shows that for a $C_3H_3F_3$ ALE precursor an HFC passivation layer can rapidly build up and prevent Si loss.

For a selective $SiO_2$ ALE process, the Si thickness loss should be minimal. The precursor dependence of Si thickness loss before Si etching stop is shown in FIG. 5(b). $C_3H_3F_3$ has the minimum Si thickness loss (2 Å) as compared to the other precursors examined ($C_4F_8$ 10 Å and $C_4F_8/H_2$ 40 Å). This result reveals that high ALE selectivity can be achieved by optimizing the chemical structure and composition of the reactive film using different precursors. These results also indicate that precursor mixing used in continuous plasma etching for improving $SiO_2$ over Si ALE selectivity is ineffective for FC-assisted ALE since the times required for suppressing substrate etching are impractically long.

The foregoing is illustrative of the present invention and is not to be construed as limiting thereof. The invention is defined by the following claims, with equivalents of the claims to be included therein.

That which is claimed:

1. A method of selectively etching a substrate comprising at least one cycle of:
    depositing a chemical precursor on a surface of the substrate to form a chemical precursor layer on the substrate, the substrate comprising a first portion and a second portion, wherein the first portion is of a different composition than that of the second portion;
    selectively removing the chemical precursor layer and at least a part of the first portion of the substrate; and
    repeating the cycle until the first portion of the substrate is substantially or completely removed, with minimal or no removal/loss of the second portion of the substrate,
    wherein deposition of the chemical precursor and selective removal of the chemical precursor layer and at least a part of the first portion of the substrate are performed under a plasma environment,
    wherein the first portion of the substrate comprises $SiO_2$,
    wherein the second portion of the substrate comprises $Si_3N_4$, and
    wherein the chemical precursor is a hydrofluorocarbon (HFC) having of chemical formula $C_kH_mF_n$, wherein k is 2, 3, or 4, m is an integer from 1 to 2k+1 inclusive, n is an integer from 1 to 2k+1 inclusive, and m=n.

2. The method of claim 1, wherein the first portion of the substrate is on the second portion of the substrate.

3. The method of claim 1, wherein the chemical precursor layer has a thickness of at least about 7 Å to about 3 nm.

4. The method of claim 1, wherein less than about 4 Å of the second portion is removed.

5. The method of claim 1, wherein the hydrofluorocarbon is selected from the group consisting of (E)-1,1,1,3-tetrafluoro-2-butene, (Z)-1,1,1,3-tetrafluoro-2-butene, 2,4,4,4-tetrafluoro-1-butene, 2,3,3-trifluoropropene, 3,3,3-trifluoropropene, 1,1,3-trifluoroprop-1-ene, 1,2,3-trifluoroprop-1-ene, 1,3,3-trifluoroprop-1-ene, 1,1,1-trifluoroethane, and 1,1,2-trifluoroethane.

6. The method of claim 1, wherein the hydrofluorocarbon is 3,3,3-trifluoropropene ($F_3C$—$CH$=$CH_2$).

7. A method of atomic layer etching comprising at least one cycle of:
    depositing a chemical precursor comprising fluorine on a surface of a substrate to form a fluorocarbon film on the surface of a first portion of the substrate, the substrate comprising the first portion on a second portion of the substrate, wherein the first portion is of a different composition than that of the second portion;
    selectively removing the fluorocarbon film and at least a part of the first portion of the substrate; and
    repeating the cycle until the first portion of the substrate is substantially or completely removed, with minimal or no removal/loss of the second portion of the substrate,
    wherein deposition of the chemical precursor and selective removal of the fluorocarbon film and at least a part of the first portion of the substrate are performed under a plasma environment,
    wherein the first portion of the substrate comprises $SiO_2$,
    wherein the second portion of the substrate comprises $Si_3N_4$, and
    wherein the chemical precursor is a hydrofluorocarbon (HFC) having of chemical formula $C_kH_mF_n$, wherein k is 2, 3, or 4, and m is an integer from 1 to 2k+1 inclusive, n is an integer from 1 to 2k+1 inclusive, and m=n.

8. The method of claim 7, wherein the hydrofluorocarbon is selected from the group consisting of (E)-1,1,1,3-tetrafluoro-2-butene, (Z)-1,1,1,3-tetrafluoro-2-butene, 2,4,4,4-tetrafluoro-1-butene, 2,3,3-trifluoropropene, 3,3,3-trifluoropropene, 1,1,3-trifluoroprop-1-ene, 1,2,3-trifluoroprop-1-ene, 1,3,3-trifluoroprop-1-ene, 1,1,1-trifluoroethane, and 1,1,2-trifluoroethane.

9. The method of claim 7, wherein the fluorocarbon film has a thickness of at least about 7 Å to about 3 nm.

10. The method of claim 7, wherein less than about 4 Å of the second portion is removed.

11. The method of claim 7, wherein the hydrofluorocarbon is 3,3,3-trifluoropropene ($F_3C$—$CH$=$CH_2$).

12. A method of selectively etching a substrate comprising at least one cycle of:
    depositing a hydrofluorocarbon having a chemical formula $C_kH_mF_n$ on an $SiO_2$ first material layer of the substrate to form a hydrofluorocarbon film on a surface of the $SiO_2$ first material layer of the substrate, the substrate comprising the $SiO_2$ first material layer on an $Si_3N_4$ second material layer;
    selectively removing the hydrofluorocarbon film and at least a part of the $SiO_2$ first material layer; and repeating the cycle until the SiO$_2$ first material layer of the substrate is substantially or completely removed, with minimal or no removal/loss of the Si$_3$N$_4$ second material layer, wherein k of chemical formula C$_k$H$_m$F$_n$ is 2, 3, or 4, m is an integer from 1 to 2k+1 inclusive, n is an integer from 1 to 2k+1 inclusive and m=n, wherein deposition of the hydrofluorocarbon and selective removal of the SiO$_2$ first material layer of the substrate are performed under a plasma environment comprising Argon (Ar), and wherein less than about 4 Å of the Si$_3$N$_4$ second material layer is removed.

13. The method of claim 12, wherein the hydrofluorocarbon is selected from the group consisting of (E)-1,1,1,3-tetrafluoro-2-butene, (Z)-1,1,1,3-tetrafluoro-2-butene, 2,4,4,4-tetrafluoro-1-butene, 2,3,3-trifluoropropene, 3,3,3-trifluoropropene, 1,1,3-trifluoroprop-1-ene, 1,2,3-trifluoroprop-1-ene, 1,3,3-trifluoroprop-1-ene, 1,1,1-trifluoroethane, and 1,1,2-trifluoroethane.

14. The method of claim 12, wherein the hydrofluorocarbon is 3,3,3-trifluoropropene (F$_3$C—CH=CH$_2$).

15. The method of claim 12, wherein the hydrofluorocarbon film has a thickness of at least about 7 Å to about 3 nm.

16. The method of claim 12, wherein less than about 4 Å of the second material layer is removed.

* * * * *

UNITED STATES PATENT AND TRADEMARK OFFICE
CERTIFICATE OF CORRECTION

PATENT NO. : 11,171,013 B2
APPLICATION NO. : 16/390223
DATED : November 9, 2021
INVENTOR(S) : Oehrlein et al.

It is certified that error appears in the above-identified patent and that said Letters Patent is hereby corrected as shown below:

In the Specification

Column 2, Line 58: Please correct "illustrates $Si_2$" to read -- illustrates $SiO_2$ --

Column 3, Line 31: Please correct "example, about 3Å" to read -- example, about 1Å --

Column 3, Line 33: Please correct "10Å nm)" to read -- 10Å (1nm) --

Column 4, Line 14: Please correct "Ln other" to read -- In other --

Column 5, Line 65: Please correct "Exemplary RFC" to read -- Exemplary HFC --

Column 7, Line 30: Please correct "$SiO_2$-$Si_3N_4SiO_2$" to read -- $SiO_2$—$Si_3N_4$—$SiO_2$ --

Column 7, Line 65: Please correct "Anions" to read -- Ar ions --

Column 9, Line 35: Please correct "150 min" to read -- 150 mm --

Column 10, Line 41: Please correct "using $C_4F_8$, $C_4F_8$" to read -- using $C_4F_8$ --

Column 11, Line 28: Please correct "(Si—NT)" to read -- (Si—NF) --

Column 11, Line 47: Please correct "$CF_2$ and $CF_3$" to read -- C—$F_2$ and C—$F_3$ --

Column 11, Lines 60 and 61: Please correct "$CF_x$" to read -- C—$F_x$ --

Column 12, Line 61: Please correct "in the F is spectra" to read -- in the F1s spectra --

Column 13, Line 15: Please correct "with Hz" to read -- with $H_2$ --

Signed and Sealed this
         Fourth Day of January, 2022

Drew Hirshfeld
*Performing the Functions and Duties of the*
*Under Secretary of Commerce for Intellectual Property and*
*Director of the United States Patent and Trademark Office*